(12) United States Patent
Perner

(10) Patent No.: US 7,071,676 B2
(45) Date of Patent: Jul. 4, 2006

(54) CIRCUIT CONFIGURATION AND METHOD FOR MEASURING AT LEAST ONE OPERATING PARAMETER FOR AN INTEGRATED CIRCUIT

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 215 days.

(21) Appl. No.: 10/681,498

(22) Filed: Oct. 8, 2003

(65) Prior Publication Data

US 2004/0100246 A1 May 27, 2004

(30) Foreign Application Priority Data

Oct. 8, 2002 (DE) .............................. 102 46 789

(51) Int. Cl.
G01R 13/02 (2006.01)
G01R 31/26 (2006.01)
G01D 1/00 (2006.01)

(52) U.S. Cl. .................... 324/76.82; 324/765; 702/127

(58) Field of Classification Search ............ 324/76.82, 324/76.77, 76.11, 76.16, 73.1, 763, 765, 158.1; 714/724, 726; 702/127
See application file for complete search history.

(56) References Cited

U.S. PATENT DOCUMENTS 5,592,077 A * 1/1997 Runas et al. ............. 324/158.1
5,796,751 A    8/1998 Kundu
5,914,902 A * 6/1999 Lawrence et al. .......... 365/201
6,549,022 B1 * 4/2003 Cole et al. .................. 324/752
6,690,189 B1 * 2/2004 Mori et al. ................. 324/765
6,714,469 B1 * 3/2004 Rickes et al. .............. 365/201
2004/0136436 A1 * 7/2004 Ainspan et al. ............ 374/143
2004/0236534 A1 * 11/2004 Wheless et al. ........... 702/127

FOREIGN PATENT DOCUMENTS

DE    198 45 409 A1    4/2000
EP    0 994 361 A2    4/2000

* cited by examiner

*Primary Examiner*—Anjan Deb
*Assistant Examiner*—Hoai-An D. Nguyen
(74) *Attorney, Agent, or Firm*—Laurence A. Greenberg; Werner H. Stemer; Ralph E. Locher

(57) ABSTRACT

A circuit configuration for measuring at least one operating parameter for an integrated circuit includes an analysis circuit connected to at least one external connection on the integrated circuit. The analysis circuit detects a plurality of voltage level changes on the external connection, which is used to control a method of operation for the integrated circuit, in particular, and supplies them to a counter circuit that logs at least one digitally coded value. The coded value is, then, output for analysis purposes to ascertain at least one operating parameter. This, advantageously, allows an average mode of operation for the integrated circuit to be logged during operation of the circuit in the application using parameters and allows respective operating states to be ascertained.

19 Claims, 1 Drawing Sheet

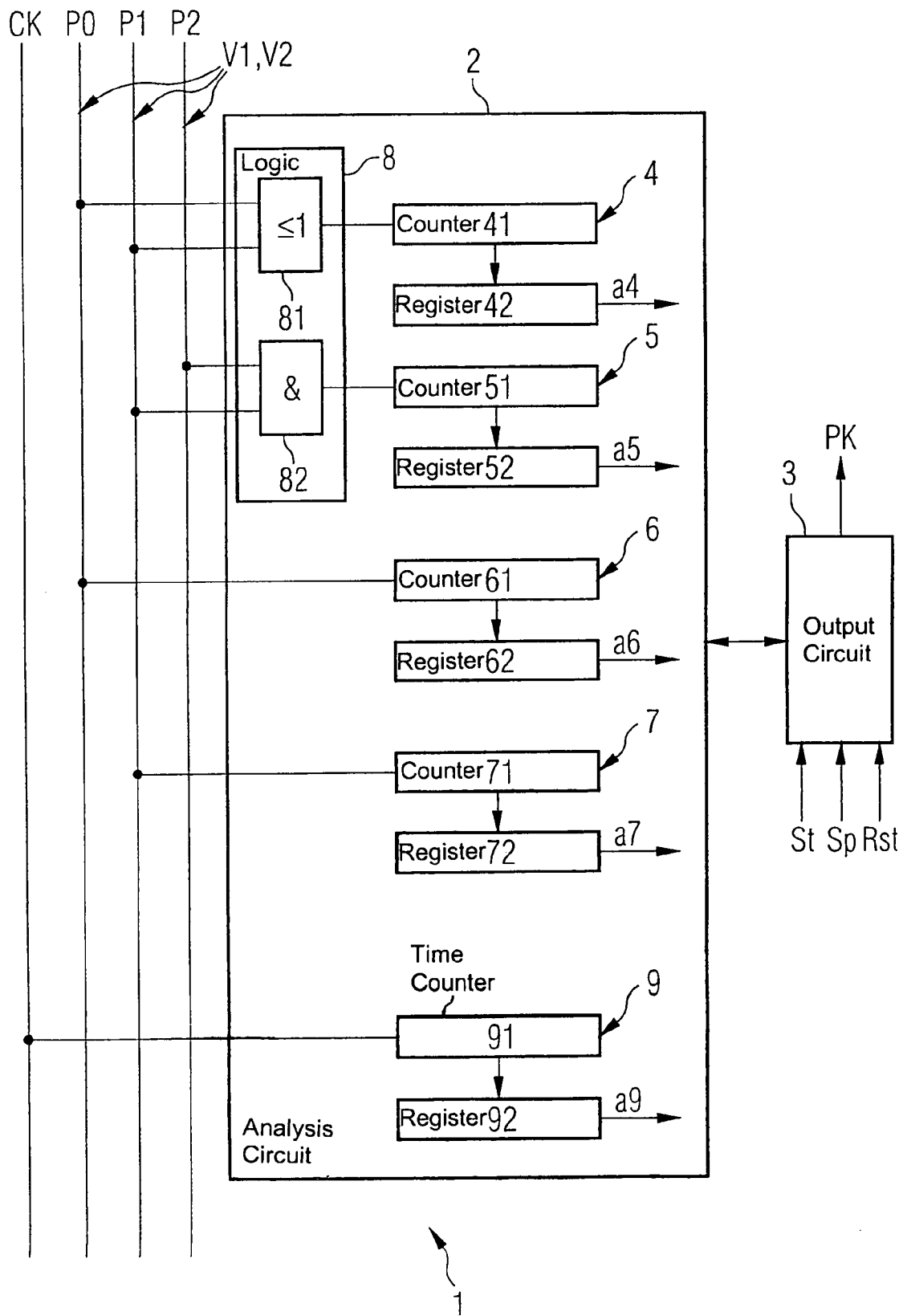

CIRCUIT CONFIGURATION AND METHOD FOR MEASURING AT LEAST ONE OPERATING PARAMETER FOR AN INTEGRATED CIRCUIT

BACKGROUND OF THE INVENTION

Field of the Invention

The present invention relates to a circuit configuration and a method for measuring at least one operating parameter for an integrated circuit.

Integrated circuits can have different operating states that result, in particular, from their being operated in different operating states. By way of example, in an integrated memory circuit, it is possible to distinguish between a read operation and a write operation that have different circuit parts in operation, depending on the design of the memory. In addition, different operating states in a memory, for example, can result from write or read access involving access to different memory areas or to a different number of memory banks.

The operating states of an integrated circuit are generally specified in a datasheet. In this context, there is the problem that a precise operating state in which an electrical or physical parameter for the circuit needs to be determined is often not specified accurately enough. When stipulating operating states for specifying parameters in datasheets, it is often possible to establish differences particularly between the manufacturers of integrated circuits. In particular, it is often not possible to compare, by way of example, operating currents in integrated circuits from different manufacturers with one another directly if a manufacturer A takes into account a different side effect in the measurement than a manufacturer B, who does not include such a side effect in the measurement. A similar situation applies when ascertaining operating temperatures or when ascertaining the power consumption of an integrated circuit.

So that it is possible to establish beyond doubt that an integrated circuit is operating correctly, the integrated circuit is, generally, subjected to a function test during the manufacturing process. Particularly in a test mode for an integrated memory, it is necessary to test the memory as close to the application as possible. In such a case, the memory is usually tested under various operating conditions. To this end, by way of example, prescribed data values are written to memory cells in the memory cell array and are, then, read again so that they can be compared with the prescribed data values. In this context, it has, generally, not been possible to date to compare a characteristic mode of operation for the application with the mode of operation of the function test directly to be able to establish whether or not the integrated circuit has been tested close to the application. In particular, it has not yet been possible to date to obtain a reliable statement as to whether or not the integrated circuit has gone through all the integrated circuit's operating modes in the function test during the manufacturing process in the same manner as in the subsequent application.

Diverse areas of use, particularly for integrated memory circuits in Personal Digital Assistants, mobile telephones, and other applications, and an ever faster growing product diversity mean that it would be of great benefit to be able to ascertain an operating parameter for an integrated circuit easily, particularly during operation of the circuit, in the application, in order to be able to trace application-specific operating conditions. Such operating parameters could represent an aid to determining the test coverage of a function test.

SUMMARY OF THE INVENTION

It is accordingly an object of the invention to provide a circuit configuration and method for measuring at least one operating parameter for an integrated circuit that overcome the hereinafore-mentioned disadvantages of the heretofore-known devices and methods of this general type and that measures at least one operating parameter for an integrated circuit that can easily be used to ascertain an operating parameter for an integrated circuit during operation of the circuit in the application.

With the foregoing and other objects in view, there is provided, in accordance with the invention, a circuit configuration for measuring at least one operating parameter for an integrated circuit, including a counter circuit logging at least one digitally coded value characterizing at least one operating parameter for specifying a mode of operation for the integrated circuit, an analysis circuit to be connected to at least one external connection on the integrated circuit, the analysis circuit detecting a plurality of voltage level changes on the external connection and supplying the voltage level changes to the counter circuit and an output circuit connected to the analysis circuit, the output circuit externally outputting the at least one digitally coded value or a value derived therefrom.

The inventive circuit configuration has an analysis circuit that is connected to at least one external connection on the integrated circuit. The analysis circuit detects a plurality of voltage level changes on an external connection on the integrated circuit and supplies them to a counter circuit. As such, the counter circuit logs a digitally coded value that characterizes at least one operating parameter for the integrated circuit. An output circuit is connected to the analysis circuit and is used for externally outputting the coded value or a value derived therefrom, particularly, an averaged value.

This means that voltage level changes on external connections on an integrated circuit, which are used to control a mode of operation for the integrated circuit, in particular, can be logged in an instruction coded or pin coded form, for example, and can, subsequently, be digitally averaged in registers and output, in particular. This makes it advantageously possible to log an average mode of operation for the integrated circuit based upon a characteristic set of parameters and to ascertain respective operating states therefrom. The logged parameters can be output through the output circuit with a suitable log on request.

The analysis circuit can be provided externally, for example, as a "flip chip", internally, for example, in a "package", or, else, in the form of an integrated circuit on the silicon. In such a case, an internal circuit has the advantage that the signals can be tapped off from the signal paths largely without interference and that the analysis circuit has already been implemented on large scale integrated platforms as well. An external circuit has the advantage that the analysis circuit would need to be connected to the integrated circuit only when required.

To ascertain a characteristic set of parameters, the analysis circuit in one embodiment of the invention is connected to a plurality of external connections on the integrated circuit and also has a plurality of counter circuits. Each of the counter circuits is connected to one or more of the external connections through a different combinational logic circuit and, respectively, logs at least one digitally coded value.

Hence, the analysis circuit detects a plurality of voltage level changes on the external connections in different ways so that a plurality of different operating parameters can be ascertained from the digitally coded values.

In one advantageous development of the invention, the analysis circuit has a time counter circuit that is connected to a connection for a clock signal and is used to log a defined period of time. The provision of such a time counter circuit makes it possible to log the average mode of operation of the integrated circuit. To such an end, the digitally coded value(s) on the corresponding counter circuit are related to the averaging time logged using the time counter circuit. Averaging the digitally coded values allows more meaningful operating parameters for the integrated circuit to be obtained in defined cases.

In this regard, it is particularly advantageous if, upon reaching an averaging time that is a binary multiple during the measurement, the respective coded value logged up until then is related to this averaging time. This allows more precise averaging because exact division by the averaging time that is a binary multiple is possible. The coded value logged up until then is, advantageously, copied to a respective register circuit, which is associated with a respective counter circuit, and is stored there and is available for the next division operation with the averaging time without the measurement needing to be stopped for such a purpose. In addition, it advantageously allows the respective stored value to be used for logged output at all times.

In accordance with another feature of the invention, the external connection is used to control a method of operation for the integrated circuit.

In accordance with a further feature of the invention, the counter circuit logs the voltage level changes over a defined period of time.

In accordance with an added feature of the invention, the analysis circuit is to be connected to a plurality of external connections on the integrated circuit and the counter circuit has a combinational logic circuit and is connected to the external connections through the combinational logic circuit.

In accordance with an additional feature of the invention, the combinational logic circuit is one of hardwired and variably programmable.

In accordance with yet another feature of the invention, the counter circuit is a plurality of counter circuits and each of the counter circuits has an associated register to which a content of a respective associated one of the counter circuits is copied and stored.

In accordance with yet a further feature of the invention, the counter circuit has an associated register to which a content of the counter circuit is copied and stored.

With the objects of the invention in view, in an integrated circuit having modes of operation, at least one operating parameter, and at least one external connection, there is also provided a circuit configuration for measuring the at least one operating parameter, including a counter circuit logging at least one digitally coded value characterizing the at least one operating parameter for specifying a mode of operation for the integrated circuit, an analysis circuit connected to the at least one external connection, the analysis circuit detecting a plurality of voltage level changes on the external connection and supplying the voltage level changes to the counter circuit, and an output circuit connected to the analysis circuit, the output circuit externally outputting the at least one digitally coded value or a value derived therefrom.

With the objects of the invention in view, there is also provided a method for measuring at least one operating parameter for an integrated circuit, including the steps of detecting a plurality of voltage level changes on at least one external connection with an analysis circuit connected to the at least one external connection on the integrated circuit, logging voltage level changes with the analysis circuit in a counter circuit utilizing at least one digitally coded value, and outputting the coded value or a value derived from the coded value for purposes of analysis to ascertain at least one operating parameter for specifying a mode of operation for the integrated circuit.

With the objects of the invention in view, there is also provided a method for measuring at least one operating parameter for an integrated circuit, including the steps of connecting an analysis circuit to at least one external connection on the integrated circuit, detecting a plurality of voltage level changes on the at least one external connection with the analysis circuit, logging voltage level changes with the analysis circuit in a counter circuit utilizing at least one digitally coded value, and subsequently outputting the coded value or a value derived from the coded value and analyzing the coded value or the value derived from the coded value to ascertain at least one operating parameter for specifying a mode of operation for the integrated circuit.

In accordance with yet an added mode of the invention, there are provided the steps of connecting the analysis circuit to a plurality of external connections on the integrated circuit, detecting voltage level changes on the external connections in a plurality of different ways utilizing the analysis circuit, logging the voltage level changes with the analysis circuit in a plurality of counter circuits utilizing respective digitally coded values, and ascertaining a plurality of different operating parameters from the digitally coded values.

In accordance with yet an additional mode of the invention, there are provided the steps of providing the at least one external connection as a plurality of external connections on the integrated circuit, providing the counter circuits as a plurality of counter circuits, connecting the analysis circuit to the external connections, utilizing the analysis circuit to detect voltage level changes on the external connections in a plurality of different ways and to log voltage level changes in the counter circuits using respective digitally coded values, and ascertaining a plurality of different operating parameters from the digitally coded values.

In accordance with a concomitant mode of the invention, the coded values or the values derived from the coded values are averaged.

Other features that are considered as characteristic for the invention are set forth in the appended claims.

Although the invention is illustrated and described herein as embodied in a circuit configuration and method for measuring at least one operating parameter for an integrated circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE is a fragmentary block circuit diagram of an advantageous embodiment of an inventive circuit configuration for measuring an operating parameter for an integrated circuit according to the invention.

DESCRIPTION OF THE PREFERRED EMBODIMENTS

Referring now to the single FIGURE of the drawing, an advantageous embodiment of an inventive circuit configuration for measuring an operating parameter for an integrated circuit is shown. This example illustrates external connections P0 to P2 on an integrated circuit that are used to control a method of operation for the integrated circuit. The connections P0 to P2 are in the form of instruction connections or address connections, for example. The number of external connections that can be evaluated is unlimited in principle. In addition, the integrated circuit has a connection for a clock signal CK. In line with the invention, a circuit configuration 1 for measuring various operating parameters for the integrated circuit is connected to the external connections P0 to P2 and to the connection for the clock signal CK on the integrated circuit. The circuit configuration 1 contains an analysis circuit 2 for detecting voltage level changes and an output circuit 3, in this case in the form of a controller. In this context, the analysis circuit 2 and the controller 3 are connected to one another for the purpose of interchanging data and control signals.

The analysis circuit 2 contains respective counter circuits 41, 51, 61, 71 that are connected directly or indirectly to one or more of the external connections P0 to P2. In addition, the analysis circuit 2 has a time counter circuit 91 that is connected to the connection for the clock signal CK and is used for logging a period of time. The time counter circuit 91 is in the form of a binary counter in the present embodiment, as are the rest of the counter circuits 41, 51, 61, 71. Such a binary counter generally includes a line of series-connected multivibrators in the form of flipflop circuits operating in succession. In this context, the states stored in the respective flipflop circuits represent a respective bit with a different significance in a digital value coded in this manner. In particular, the flipflop that receives the voltage level change on the respective connection represents the least significant bit, and the last flipflop in the flipflop line represents the most significant bit.

In the present exemplary embodiment, the counter circuits 41 and 51 are connected to the external connections P0 to P2 through a combinational logic circuit 8. In particular, the counter circuit 41 is connected to the external connections P0 and P1 through an OR gate 81, and the counter circuit 51 is connected to the external connections P1 and P2 through an AND gate 82. The counter circuits 61 and 71 are connected directly to the external connections P0 and P1, respectively, and, thus, count each voltage level change between the voltages V1 and V2 on the external connections P0 and P1. The time counter circuit 91 counts with each rising clock edge and, as such, logs a period of time that can be used for averaging the digital values logged in the rest of the counter circuits.

Each of the counter circuits 41 to 91 has an associated register 42, 52, 62, 72 or 92 to which the respective digitally coded value 4, 5, 6, 7, or the time value 9 from the respective associated counter circuit is copied. The output signals a4, a5, a6, a7, and a9 are used to output the contents of these registers to the controller 3.

The combinational logic circuits 81, 82 are hardwired or variably programmable. The latter means, by way of example, that the combinational logic circuits are produced semiflexibly by programmable simple AND, OR, or exclusive-OR gates. In addition, the combinational logic circuits can be integrated in universally programmable form in a manner typical of Gate Array Logic. In such a case, the procedure would be initiated by a test mode, in which case either the combinational logic circuit to be programmed or the counter register to be used would be addressed and a programming log would be used to store the evaluation logic that is to be programmed in a volatile or nonvolatile memory that controls the flexible combinational logic.

The mode of operation of the present embodiment of a circuit configuration for measuring operating parameters is explained in more detail below.

At the start of measurement, the binary counters 41 to 91, which are 32 bits in length, for example, are reset to 0. The measurement can be started by a test mode, or the start is initiated by appropriately polling a start input pin provided for the purpose. In the present exemplary embodiment, the start of the measurement is initiated using the signal St on the controller 3. The measurement is stopped using a stop signal Sp on the controller 3, and the reset signal Rst is used to reset the respective counters. Following the start of measurement, each voltage level change between the voltages V1 and V2 on the external connections P0 and P1 is counted, or voltage level changes on a respective group combination of the external connections P0 to P2 are counted. The stop signal Sp immediately stops the counting process and, then, divides the values 4 to 7 from the corresponding counter circuits 41 to 71 by the time value 9 from the counter circuit 91. This division operation is brought about by a "shift right" operation on the respective contents of the counter circuits, which is equivalent to dividing by a multiple of the number 2. In this case, the shift right operation is determined by the content of the counter circuit 91 that logs the elapsed averaging time period. As such, a set of characteristic averaged parameters up to a maximum error of the factor 2 is ascertained, with the parameters being able to be specified by virtue of multiple averaging.

An embodiment with more precise averaging that is improved in this regard provides for the current counter content to be copied to an associated register upon reaching an averaging time that is a binary multiple. Such registers are shown in the FIGURE using the registers 42, 52, 62, 72 and 92. These values stored in the registers are used to allow exact division by the averaging time that is a binary multiple. Another advantage is that the values stored in the registers 42 to 92 can be used for logged output at all times.

The log PK that is output by the controller 3 can include any binary-coded parameters, such as operating temperature, current drawn, voltage supply etc. In this context, transmission can take place in parallel, serially, or in a combination of the two.

In one instance of application, the inventive circuit configuration shown in the FIGURE can be used, by way of example, to ascertain a set of operating parameters for an integrated memory circuit. In this case, the following are of interest, for example:

how many voltage level changes take place per unit time on address, command, and data pins;

how many instruction changes take place per unit time;

how many activation commands, precharging commands, write, read, and refresh access operations are carried out;

how many memory bank changes take place per unit time;

how much noise the chip experiences when it is not being addressed;

whether or not there is a certain rhythm in the addressing of the memory (for example, "X-fast" or "Y-fast");

whether or not there is a certain rhythm in the instruction sequence;

in what percentage the semiconductor memory is used for read and write access; and how much operating current the memory chip draws.

These operating states can be calculated directly in the controller 3 using the individual logged parameters for the analysis circuit 2, or, else, the individual parameters are transmitted to the outside and are evaluated there.

I claim:

1. A circuit configuration for measuring at least one operating parameter for an integrated circuit, comprising:
    a counter circuit logging at least one digitally coded value characterizing at least one operating parameter for specifying a mode of operation for the integrated circuit;
    an analysis circuit to be connected to at least one external connection on the integrated circuit, said analysis circuit detecting a plurality of voltage level changes on the external connection and supplying the voltage level changes to said counter circuit; and
    an output circuit connected to said analysis circuit, said output circuit externally outputting said at least one digitally coded value or a value derived therefrom.

2. The circuit configuration according to claim 1, wherein the external connection is used to control a method of operation for the integrated circuit.

3. The circuit configuration according to claim 1, wherein said counter circuit logs the voltage level changes over a defined period of time.

4. The circuit configuration according to claim 1, wherein:
    said analysis circuit is to be connected to a plurality of external connections on the integrated circuit; and
    said counter circuit has a combinational logic circuit and is connected to the external connections through said combinational logic circuit.

5. The circuit configuration according to claim 4, wherein:
    said counter circuit has combinational logic circuits;
    said analysis circuit is to be connected to a plurality of external connections on the integrated circuit and has a plurality of counter circuits; and
    each of said counter circuits is to be connected to at least one of the external connections through a different one of said combinational logic circuits and respectively logs at least one digitally coded value.

6. The circuit configuration according to claim 1, wherein:
    said counter circuit has combinational logic circuits;
    said analysis circuit is to be connected to a plurality of external connections on the integrated circuit and has a plurality of counter circuits; and
    each of said counter circuits is to be connected to at least one of the external connections through a different one of said combinational logic circuits and respectively logs at least one digitally coded value.

7. The circuit configuration according to claim 4, wherein said combinational logic circuit is one of hardwired and variably programmable.

8. The circuit configuration according to claim 1, wherein:
    said counter circuit is a plurality of counter circuits; and
    each of said counter circuits has an associated register to which a content of a respective associated one of said counter circuits is copied and stored.

9. The circuit configuration according to claim 1, wherein said counter circuit has an associated register to which a content of said counter circuit is copied and stored.

10. The circuit configuration according to claim 1, wherein said analysis circuit has a time counter circuit connected to a clock signal connection for logging a defined period of time.

11. In an integrated circuit having modes of operation, at least one operating parameter, and at least one external connection, a circuit configuration for measuring the at least one operating parameter, comprising:
    a counter circuit logging at least one digitally coded value characterizing the at least one operating parameter for specifying a mode of operation for the integrated circuit;
    an analysis circuit connected to the at least one external connection, said analysis circuit detecting a plurality of voltage level changes on the external connection and supplying the voltage level changes to said counter circuit; and
    an output circuit connected to said analysis circuit, said output circuit externally outputting said at least one digitally coded value or a value derived therefrom.

12. A method for measuring at least one operating parameter for an integrated circuit, which comprises:
    detecting a plurality of voltage level changes on at least one external connection with an analysis circuit connected to the at least one external connection on the integrated circuit;
    logging voltage level changes with the analysis circuit in a counter circuit utilizing at least one digitally coded value; and
    outputting the coded value or a value derived from the coded value for purposes of analysis to ascertain at least one operating parameter for specifying a mode of operation for the integrated circuit.

13. The method according to claim 12, which further comprises:
    connecting the analysis circuit to a plurality of external connections on the integrated circuit;
    detecting voltage level changes on the external connections in a plurality of different ways utilizing the analysis circuit;
    logging the voltage level changes with the analysis circuit in a plurality of counter circuits utilizing respective digitally coded values; and
    ascertaining a plurality of different operating parameters from the digitally coded values.

14. The method according to claim 12, which further comprises:
    providing the at least one external connection as a plurality of external connections on the integrated circuit;
    providing the counter circuits as a plurality of counter circuits;
    connecting the analysis circuit to the external connections;
    utilizing the analysis circuit to detect voltage level changes on the external connections in a plurality of different ways and to log voltage level changes in the counter circuits using respective digitally coded values; and
    ascertaining a plurality of different operating parameters from the digitally coded values.

15. The method according to claim 12, which further comprises averaging the coded value or the value derived from the coded value.

16. The method according to claim 13, which further comprises averaging the coded values.

17. The method according to claim 14, which further comprises averaging the coded values.

18. The method according to claim 12, which further comprises, upon reaching an averaging time that is a binary multiple during a measurement, relating the respective coded value logged up until the averaging time to the averaging time.

19. A method for measuring at least one operating parameter for an integrated circuit, which comprises:

connecting an analysis circuit to at least one external connection on the integrated circuit;

detecting a plurality of voltage level changes on the at least one external connection with the analysis circuit;

logging voltage level changes with the analysis circuit in a counter circuit utilizing at least one digitally coded value; and subsequently outputting the coded value or a value derived from the coded value and analyzing the coded value or the value derived from the coded value to ascertain at least one operating parameter for specifying a mode of operation for the integrated circuit.

* * * * *